(12) United States Patent
Zink

(10) Patent No.: US 9,255,950 B2
(45) Date of Patent: Feb. 9, 2016

(54) METHOD AND ARRANGEMENT FOR FREQUENCY DETERMINATION

(75) Inventor: Fabian Zink, Detmold (DE)

(73) Assignee: Phoenix Contact GmbH & Co. KG (DE)

( * ) Notice: Subject to any disclaimer, the term of this patent is extended or adjusted under 35 U.S.C. 154(b) by 267 days.

(21) Appl. No.: 13/814,365

(22) PCT Filed: Sep. 27, 2011

(86) PCT No.: PCT/EP2011/004820
§ 371 (c)(1),
(2), (4) Date: Apr. 2, 2013

(87) PCT Pub. No.: WO2012/041481
PCT Pub. Date: Apr. 5, 2012

(65) Prior Publication Data
US 2013/0182815 A1    Jul. 18, 2013

(30) Foreign Application Priority Data

Sep. 29, 2010  (DE) .......................... 10 2010 046 880

(51) Int. Cl.
*G01G 23/02*   (2006.01)
*G01R 23/02*   (2006.01)
*G01R 23/10*   (2006.01)

(52) U.S. Cl.
CPC ................ *G01R 23/02* (2013.01); *G01R 23/10* (2013.01)

(58) Field of Classification Search
CPC ........ G01R 23/00; G01R 23/02; G01R 23/09; G01R 23/10; G01R 29/02; G01R 29/26; G01R 31/2824; G01R 31/31709

USPC .......... 324/76.39, 76.62, 76.52, 76.48, 76.13, 324/76.16, 76.19, 76.25, 76.41, 76.77; 702/79; 377/19–20
See application file for complete search history.

(56) References Cited

U.S. PATENT DOCUMENTS 4,162,443 A * 7/1979 Brearley et al. ............ 324/76.58
4,454,470 A * 6/1984 Boettner et al. ............ 324/76.62
(Continued)

FOREIGN PATENT DOCUMENTS

EP    1103815 A2    5/2001
FR    2566132 A1    12/1985
(Continued)

OTHER PUBLICATIONS

Yolaine Cussac, "Related International Patent Application No. PCT/EP2011/004820 International Preliminary Report on Patentability", Apr. 11, 2013, Publisher: PCT, Published in: EP.
Hermann Koll, "Related International Patent Application No. PCT/EP2011/004820 International Search Report", Jan. 11, 2012, Publisher: PCT, Published in: EP.
(Continued)

*Primary Examiner* — Tung X Nguyen
*Assistant Examiner* — Thang Le
(74) *Attorney, Agent, or Firm* — Kaplan Breyer Schwarz & Ottesen, LLP

(57) ABSTRACT

In a method for determining a frequency of an input signal, a first count value is determined by counting clock edges of a reference clock signal while the input signal corresponds to a first level value. Further, a second count value is determined by counting clock edges of the reference clock signal while the input signal corresponds to a second level value. The frequency of the input signal is determined as a function of the first and the second count value.

4 Claims, 2 Drawing Sheets

(56) References Cited

U.S. PATENT DOCUMENTS

| | | | | |
|---|---|---|---|---|
| 4,609,990 | A | * | 9/1986 | Sember et al. .................. 702/78 |
| 5,095,264 | A | * | 3/1992 | Hulsing, II ................. 324/76.47 |
| 5,097,490 | A | * | 3/1992 | Hulsing et al. .................. 377/28 |
| 5,663,970 | A | * | 9/1997 | Bae ........................ G01R 23/15 324/76 |
| 5,815,819 | A | * | 9/1998 | Ohta ................... H04W 52/029 455/574 |
| 5,818,881 | A | * | 10/1998 | Guiffant ............. H04L 27/1563 329/303 |
| 7,688,932 | B2 | * | 3/2010 | Roquelaure .... G01R 31/318527 377/28 |
| 2004/0100245 | A1 | * | 5/2004 | Oishi ..................... G01R 23/10 324/76.39 |

FOREIGN PATENT DOCUMENTS

| | | |
|---|---|---|
| GB | 1539666 | 1/1979 |
| JP | 57096269 A | 6/1982 |
| JP | 08210875 A | 8/1996 |

OTHER PUBLICATIONS

Motorola, "M68300 Family / MC68332 User's Manual // http://www.freescale.com/webapp/sps/site/prod_summary.jsp?code-MC68332&fpsp=1&t", 2004, Publisher: Motorola, Published in: US.

E. Schruefer, "Elektrische Messtechnik", "Messung Elektrischer und Nichtelektrischer Groeben", 1983, pp. 313-316; 318-319, vol. 326, No. 29, Publisher: Carl Hanser Verlag Muenchen Wien, Published in: DE.

Richard Soja, "Freescale Semiconductor, Inc.: Programmable Time Accumulator TPU Function (PTA)", "Freescale Semiconductor, Inc.", , Publisher: http://www.freescale.com/webapp/sps/site/prod_summary.jsp?code=MC68332&fpsp=1&tab=Documentation_Tab, Published in: US.

Dipl.-ing. Schmidt-Bilkenroth, "Related German Patent Application No. 10 2010 046 880.0 Office Action", Aug. 16, 2011, Publisher: German Patent Office, Published in: DE.

* cited by examiner

METHOD AND ARRANGEMENT FOR FREQUENCY DETERMINATION

FIELD OF THE INVENTION

The invention relates to a method for determining a frequency of an input signal and an arrangement for determining frequency.

BACKGROUND OF THE INVENTION

In many applications in the field of electronics signal processing, it is necessary to determine the frequency of an external applied input signal. With a conventional method, such as with an input signal which can assume two different level states for example, the number of clock periods of the reference clock signal is counted during the duration of one period of the input signal. Using the count result, the frequency of the input signal can be determined from the known frequency of the reference clock signal. The frequency of the input signal determined in this way is made available in the form of an analog or digital value for further processing.

However, with a frequency measurement method of this kind, problems can repeatedly occur when the frequency of the input signal varies. For example, it is only possible to make a definitive statement concerning the frequency of the input signal applied at a particular instant when at least one period of the input signal is complete and a counter result is available for this period. In addition, a step response time of the overall system depends on the frequency of the input signal so that responses of the measuring system of several seconds can occur with low input frequencies of a few hertz. This results in a significant delay in determining the frequency of the input signal when the input frequency changes from several kilohertz, for example, to a few hertz. This delay is largely determined by the new frequency which, theoretically, can also assume the value 0 Hz. As, in this case, it is no longer possible to determine a complete period of the input signal, the step response time of the measuring system in this case is infinite. When the frequency of the input signal decreases, with the conventional method, the frequency determination can therefore only be reliably determined after an extended period or, under certain circumstances, not at all.

SUMMARY OF THE INVENTION

The object of the invention is therefore to specify a method and an arrangement for determining the frequency of an input signal which enable the frequency to be determined more reliably.

In an embodiment of a method for determining a frequency of an input signal, a first count value is determined in that clock edges of a reference clock signal are counted while the input signal corresponds to a first level value. Furthermore, a second count value is determined in that clock edges of the reference clock signal are counted while the input signal corresponds to a second level value. The frequency is determined as a function of the first and second count values.

For example, the input signal has two levels states, one of which one corresponds to a Low level and the other to a higher level or High level. In the case of an analog input signal with continuous oscillation behavior, for example a sinusoidal oscillation, the two signal levels can be determined in that a specified signal value in the input signal is exceeded or is not reached. The two level states define respective level phases of the input signal with respect to time. Two successive different level phases characterize a measuring period. The input signal can also be any periodic signal or an oscillating signal.

By separately counting clock edges of the reference clock signal during the first level phase and the second level phase in the input signal, it is not necessary with the described method to wait for the full period duration of each period in the input signal to be able to re-determine a frequency value, and it is possible to carry out the new frequency determination with every level change in the input signal. In this connection, the frequency determination is in each case based on the previously determined first and second count value.

When the frequency of the input signal and therefore its period duration and the duration of the first and second level phase change, the frequency which is determined using the described method on the first level change after the frequency change, approximates to the actual frequency of the input signal. On the second level change, that is to say after the expiry of a full period at the new frequency of the input signal, the frequency determination delivers the actual value. The reliability of the frequency determination is therefore increased with the described method.

In an embodiment of the described method, the frequency is determined as a function of the sum of the first and the second count value. With this embodiment, the first and the second count value of a measuring period are added and, for example, expressed as a ratio of a known frequency $f_{osc}$ of the reference clock signal so that the frequency $f_{in}$ of the input signal is given by $$f_{in} = f_{osc}/(N1+N2),$$

where N1 is the first count value and N2 is the second count value.

In an improvement of the invention, it can also be specified that the sum of first and second count values of one or more such successive measuring periods in the input signal are used for determining the frequency. For example, it can be stipulated that a certain number of measuring periods in the input signal is used for determining the frequency, so that this number of successive first count values and the corresponding number of second count values are added together in order to determine the value of the frequency of the input signal from the frequency of the reference clock signal. This can be expressed, for example, by the formula $$f_{in} = p \cdot f_{osc}/\Sigma(N1_i+N2_i),$$

where p is the number of measuring periods used, $N1_i$ is the first count value of an i-th measuring period, and $N2_i$ is the second count value of an i-th measuring period.

As a result of the greater measuring period in the input signal, the accuracy of the frequency determination is further increased, which improves the reliability of the frequency determined.

In a further embodiment of the described method, the first count value is determined in a first count operation and the second count value in a second count operation. In each of these count operations, a counter status of the respective count operation is incremented with every clock edge of the reference clock signal. In doing so, either only positive rising clock edges, negative falling clock edges or positive and negative clock edges of the reference clock signal can be counted. The count value, which in each case is determined in a count operation, can be specified by an instantaneous count status of the respective count operation or by the last count status before the input signal changes its level value, that is to say a counter result for the respective level phase of the input signal. The respective count value can change several times during a count operation while the input signal corresponds to one of the level values, wherein, in this case, the count value increases continuously as the counter status progresses. The respective count value is not greater than the counter result of a count operation. Each count operation preferably begins with the counter status 0.

In an improvement of the embodiment just described, the first count value is determined by a counter result of the first count operation when the input signal no longer corresponds to the first level value. In a similar manner, the second count value is determined by a counter result of the second count operation when the input signal no longer corresponds to the second level value. Accordingly, the first and the second count value are determined at the latest by the counter result of the respective count operation, that is to say the last counter status of the count operation, when the input signal has changed its level.

In addition, the second count value can also be determined by an instantaneous counter status in the second count operation when the input signal corresponds to the second level value and this instantaneous counter status exceeds a comparison value. Expressed another way, it is possible that the second count operation is not yet complete when the respective second count value is established, as the input signal still corresponds to the second level value. No reassessment of the second count value is carried out in the initial phase of the second count operation. However, as soon as the instantaneous counter status exceeds the comparison value in the second count operation, the second count value assumes this counter status.

Establishing the second count value before the second count operation is complete enables the frequency to be determined approximately. In this case, the second count value represents a minimum value, so to speak, for the second level phase while the input signal corresponds to the second level value, which continuously increases, until the second count operation is completed on account of the change in level in the input signal, and the count value corresponds to the counter result of the second count operation. The frequency determined in this way therefore approximates to the actual frequency value of the input signal and delivers a reliable result earlier.

The comparison value mentioned is given, for example, as a function of the first count value or the second count value of a previous measuring period in the input signal or as a function of both above-mentioned count values. For example, it can be assumed that the frequency in the input signal reduces when, in the case of an input signal with known mark-space ratio, no level change in the input signal occurs in the second count operation after a counter state which can be calculated from the first count value. In this case, it is possible to start with an approximation of the new frequency after reaching the comparison value. Alternatively or in addition, the second count value of the previous measuring period in the input signal can be used for determining the comparison value. For example, a frequency reduction in the input signal can again be assumed when the instantaneous counter status of the previous second count value is reached and the level in the input signal has not yet changed.

Tolerance values, which, in addition to the above-mentioned values, are obtained from the first count value and the previous second count value, can also be included in the determination of the comparison value. For example, the comparison value is given by adding a percentage to a value calculated from first and/or second count value. The comparison value can also be determined by comparing the magnitude of the first count value and the previous second count value so that only the larger or the smaller of the two is used as the comparison value.

An exemplary embodiment of an arrangement for determining the frequency comprises an input for feeding in an input signal as well as a first and a second counter. The first counter is used to count clock edges of a reference clock signal during a period in which the input signal corresponds to a first level value. Correspondingly, the second counter is used to count clock edges of the reference clock signal during a period in which the input signal corresponds to a second level value. Further, the arrangement comprises an evaluation unit which is coupled to the first and the second counter in order to determine a first and a second count value. The evaluation unit is set up to determine a frequency of the input signal as a function of the first and the second count value.

In different embodiments of the arrangements described, the evaluation unit of the arrangement is set up to carry out the different embodiments of the method previously described for frequency determination.

The invention is explained in more detail below with reference to exemplary embodiments with the help of the figures. In the figures, signals and elements of the same type or same function are identified by the same references.

DETAILED DESCRIPTION

Figure 1:
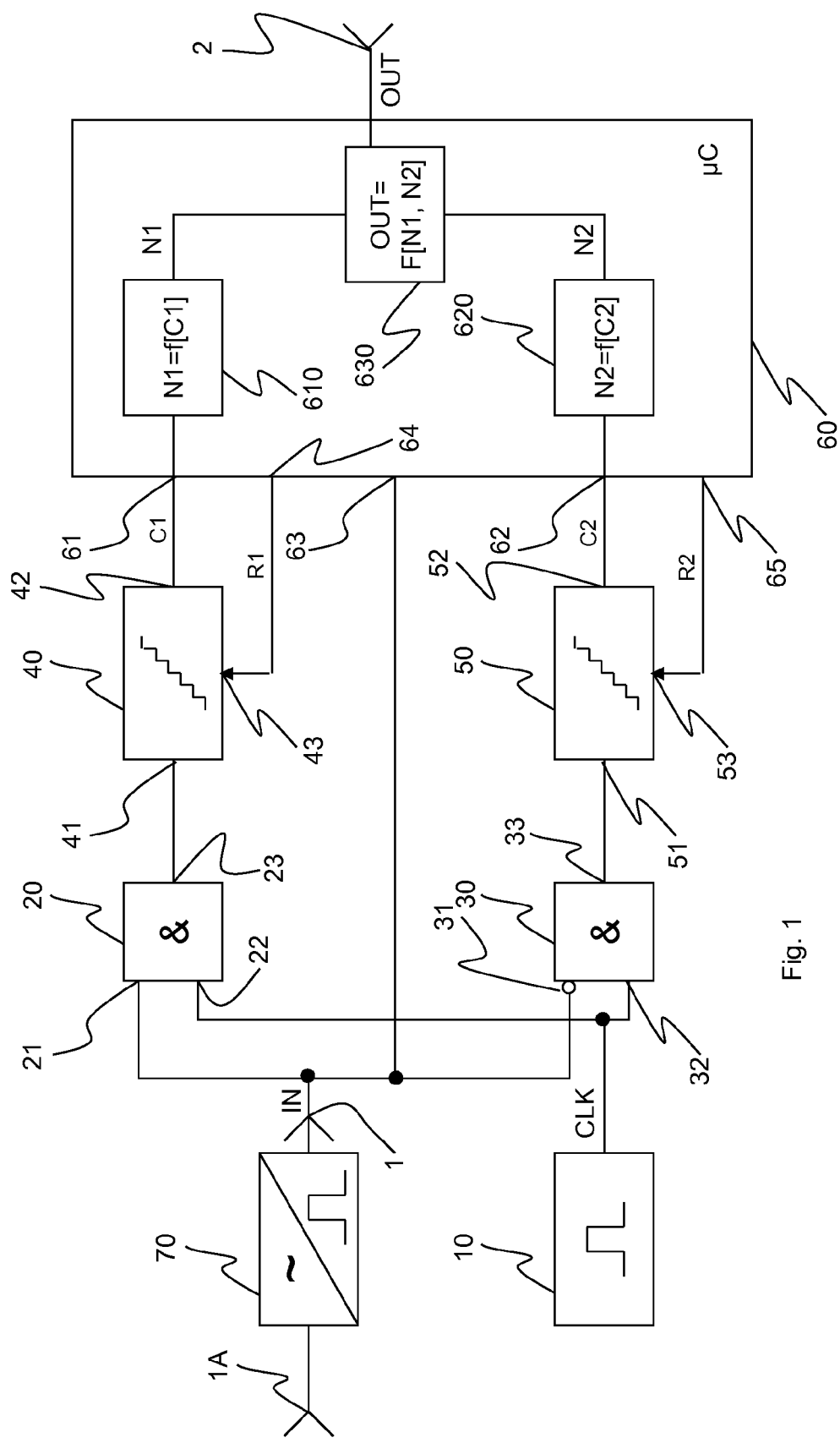
FIG. 1 shows an exemplary embodiment of an arrangement for frequency determination.

FIG. 1 shows an example of an arrangement for frequency determination which is designed to determine a frequency of an input signal IN which is applied to an input 1. The arrangement comprises a first AND gate 20, a second AND gate 30, a first counter 40, a second counter 50 and an evaluation unit 60. A pulse generator 70, which is coupled on the input side to an auxiliary input 1a, is connected upstream of the input 1 of the arrangement. A clock generator 10, which is provided for generating a reference clock signal CLK, is also shown in FIG. 1. The first AND gate 20 is coupled by its first input 21 to the input 1 and by a second input 22 to the clock generator 10. An output 23 of the AND gate 20 is connected to an input 41 of the first counter 40. In a similar manner, the second AND gate 30 is coupled by its first input 31, which is designed as an inverting input, to the input 1. The second input 32 of the AND gate 30 is coupled to the clock generator 10. An output 33 of the AND gate 30 is connected to an input 51 of the second counter 50.

The evaluation unit 60 has a first count input 61 which is coupled to an output 42 of the first counter 40. A second count input 62, to which an output 52 of the second counter 50 is connected, is also provided in the evaluation unit 60. Control connections 64, 65 of the evaluation unit 60 are coupled to control inputs 43, 53 of the first and second counter 40, 50. The evaluation unit 60 also has a signal input 63 which is connected to the input 1. Evaluation blocks 610, 620, which are connected on the input side to the first and second count input 61, 62, are shown by way of example in the evaluation unit 60. The blocks 610, 620 are coupled on the output side to a further evaluation block 630, which is connected on the output side to an output 2 of the arrangement.

The clock generator 10 can be designed as part of the arrangement for frequency determination. Alternatively, however, the reference clock signal CLK of the arrangement can be fed in externally. Depending on the required accuracy, the clock generator 10 can be designed as a crystal oscillator, as an LC resonant circuit or as some other known oscillator.

When the arrangement is in operation, a signal, which has a sinusoidal characteristic for example, is fed in via the auxiliary input 1a. A rectangular signal, which has two defined levels, is generated in the pulse generator 70, for example from the signal applied to the input side. This signal is used as the input signal IN for the arrangement for frequency determination. In different embodiments, the pulse generator 70 can also be part of the arrangement.

The input signal IN is fed to the first AND gate and, in inverted form, to the second AND gate 30. At the same time, the reference clock signal CLK is applied to the respective second inputs 22, 32 of the first and second AND gate 20, 30. Accordingly, pulses of the reference clock signal CLK are only transferred by the first AND gate 20 at the output 23 during the times when the input signal corresponds to a logic High level. In a similar manner, because of the inverting input 31, clock edges of the reference clock signal CLK at the input 32 are only transferred to the output 33 when the input signal IN corresponds to a logic Low level.

In alternative embodiments, the choice of High level for the first AND gate and Low level for the second AND gate can also be swapped. Basically, the intention is only that the reference clock signal CLK is transferred to the output 23 for a first level value and at the output 33 for a second level value.

The counters 40, 50 are set up to count clock edges of the transferred reference clock signal CLK and, in each case, to output an instantaneous counter status C1 and C2 at the output 42 and 52 respectively. Rising, falling or rising and falling clock edges can be defined as clock edges to be counted. The evaluation blocks 610, 620 are set up to determine a first and a second count value N1, N2 from the counter status C1, C2 present at the input side. The evaluation block 630 is set up to determine the frequency of the input signal IN from the first and second count value N1, N2, and to output it in a suitable form at the output 2 as an output signal OUT. The level value of the input signal IN which is fed in at the signal input 63 can also be used in the determination of the count values N1, N2.

The evaluation unit 60 can reset the counter statuses of the first and second counter 40, 50 to an initial value, for example 0, by means of control signals R1, R2 at the control outputs 64, 65.

The frequency of the input signal IN can be determined in various ways in the evaluation unit 60. Basically, the respective output signal C1, C2 of the first and second counter 40, 50 is used as a basis for determining the first and second count value N1, N2. In addition, the frequency is determined as a function of the first and second count value N1, N2, for example as a function of the sum of the first and second count value N1, N2. In different embodiments, the evaluation unit 60 can also have buffer memories or registers, in which count values N1, N2 of previous measuring periods are stored, wherein, in the present application example, a measuring period is defined as the succession of a Low phase and a High phase or a High phase and a Low phase in the input signal. In this case, the frequency can be determined as a function of the sum of first and second count values of one or more successive measuring periods in the input signal. In particular, this increases the reliability of the frequency determination when the determination is made dependent on the condition that the sum of first and second count values of one or more successive measuring periods in the input signal exceeds a limit, so that the frequency determination is based on a minimum number of counted clock edges in the reference clock signal CLK.

Other embodiments of the method for determining the frequency relate to the determination of the first and second count value N1, N2. Basically, the counter result during a level phase in the input signal IN, that is to say the highest counter status of the counter, while the input signal IN corresponds to a certain level value can be used as a count value for this purpose. Expressed another way, the counter status of the respective counter 40, 50 becomes the count value N1, N2 when the input signal IN no longer corresponds to the respective associated level value. In addition, the second count value can be determined in such a way that an instantaneous counter status C2 of the second counter 50 is used when the input signal IN corresponds to the level value and this instantaneous counter status C2 exceeds a comparison value. This comparison value can, for example, be determined from the first count value N1 present at any particular time. Alternatively or in addition, the second count value from a previous frequency determination of the input signal IN can also be used to specify the comparison value.

In a similar manner, in alternative or additional embodiments, an instantaneous counter status C1 of the first counter 40 can be used to establish the first count value N1.

Figure 2:
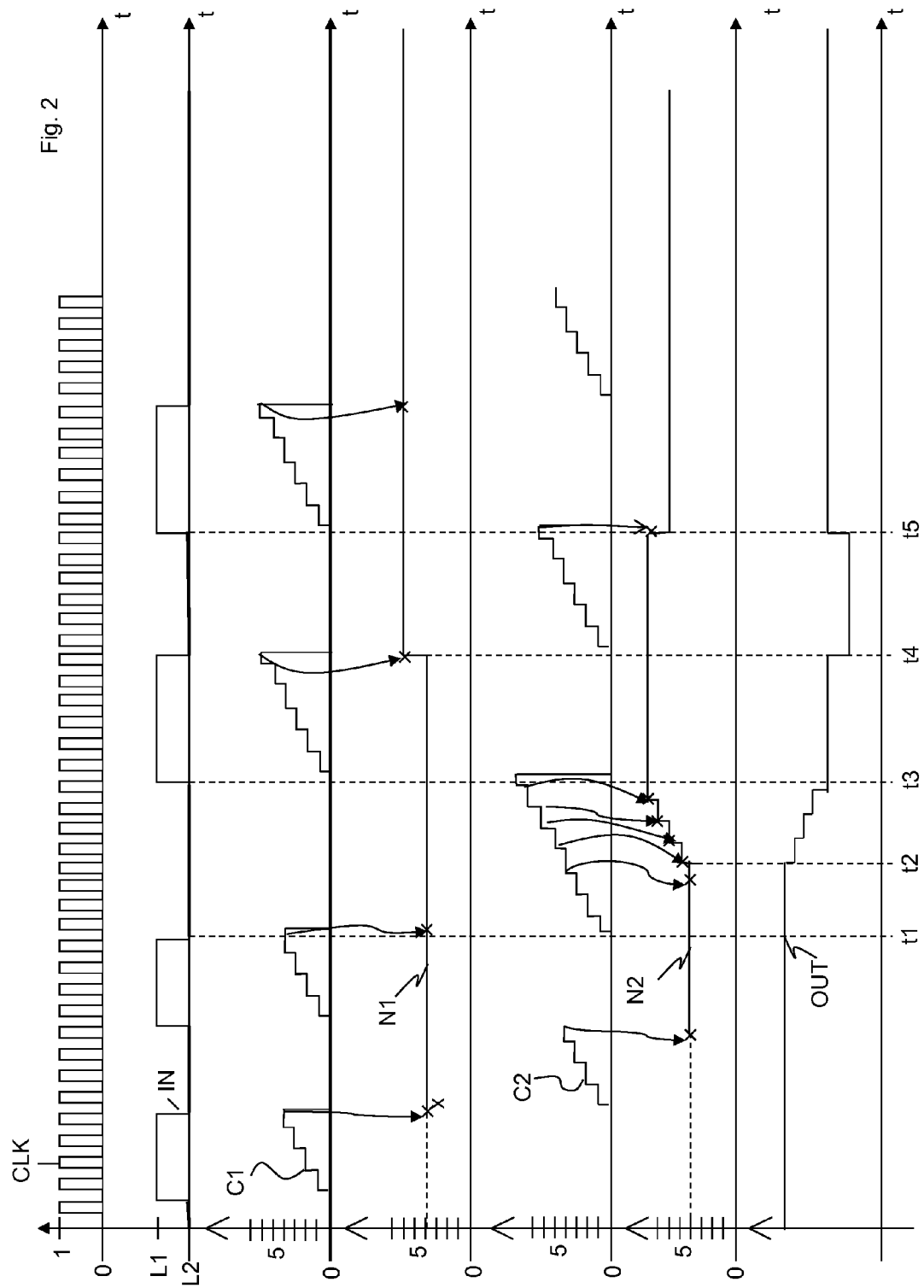
FIG. 2 shows an example of a signal-time diagram of signals within the arrangement of FIG. 1.

FIG. 2 shows an example of a signal-time diagram of different signals within the arrangement of FIG. 1. Among others, the reference clock signal CLK, which oscillates at a fixed reference frequency with a rectangular form, and the input signal IN, which alternately assumes a first level value L1 and a second level value L2, are shown. In the present example, the input signal IN changes its frequency in the period t1 to t3.

Also shown is the first counter status C1 of the first counter 40, which counts positive clock edges of the reference clock signal CLK during the High phases of the input signal IN, that is to say during the level phases during which the input signal IN corresponds to the first level value L1. At the instants in time at which the input signal IN changes its level from the first level value L1 to the second level value L2, the Low level, for example at times t1 and t4, the counter status C1 is taken as the count value N1. This can be clearly seen, particularly at time t4, at which the first count value N1 changes from four to six.

The counter status C2 of the second counter 50, which counts positive clock edges of the reference clock signal CLK during the signal level L2 of the input signal IN, is also shown in FIG. 2. In the count operation of the second counter 50 which occurs first in time and which runs as far as counter status 4, this counter status is taken as the second count value N2 at the time at which the input signal IN changes back to the High level L1. In the second count operation of the second counter 50, the counter status C2 from the value 4 is taken as the second count value N2. In addition, the counter status in this count operation is also taken as second count value N2 for further incrementing the counter status, so that this increases in steps to the value eight. This higher count value N2 at time t3 is brought about by the longer Low phase of the input signal N between t1 and t3. The assuming of the counter status C2 as count value N2 from the value four is brought about, for example, by the previous count value N2 from the first count operation.

In the subsequent third count operation of the second counter 50, the count operation ends at time t5 with the counter result 6, which is then taken as the second count value N2.

The output signal OUT, which is shown at the bottom and presents the determined frequency, is based, for example, on the known frequency $f_{osc}$ of the reference clock signal CLK divided by the sum of the count values N1, N2. According to this, the output value falls in steps in the period t2 to t3 for a constant first count value N1 and increasing second count value N2 and approximates to the actual frequency of the input signal. In the period t4 to t5, the output signal OUT reduces further due to the increased first count value N1, and at time t5, with the new second count value N2, assumes a value corresponding to the input frequency.

It must be noted that the signal-time diagram shown in FIG. 2 is only exemplary. In particular, no higher count statuses, which, in a practical application, could further increase the accuracy of the method for determining the frequency, are shown for reasons of clarity. For example, it can be stipulated that a certain number of measuring periods in the input signal is used for determining the frequency, so that this number of successive first count values and the corresponding number of second count values are added together in order to determine the frequency of the input signal.

The output signal OUT can be output as an analog value by the evaluation unit 60, which is designed as a microcontroller, for example. As an example, a signal is output in the form of a current value in the range from 4 to 20 milliamps or in the form of a voltage value in the range from 0 to 10 volts. Alternatively, the output signal OUT can also be output as a rectangular clock signal with a frequency corresponding to the input signal, wherein preferably an adjustable divider is used for this purpose.

An arrangement and a method as described above can be used, for example, in a relay for signaling a threshold value.

What is claimed is:

1. An arrangement for determining frequency, comprising:
an input (1) for feeding in an input signal (IN);
a first counter (40) for counting clock edges of a reference clock signal (CLK) while the input signal (IN) corresponds to a first level value (L1);
a second counter (50) for counting clock edges of the reference clock signal (CLK) while the input signal (IN) corresponds to a second level value (L2); and
an evaluation unit (60) that is coupled to the first and the second counter (40, 50), in order to determine a first and a second count value (N1, N2), and is set up to determine a frequency of the input signal (IN) as a function of the first and the second count value (N1, N2);
wherein the evaluation unit (60) is set up to determine the frequency of the input signal (IN) as a function of the sum of the first and second count values of one or more successive measuring periods in the input signal (IN); and
wherein the evaluation unit (60) is set up to determine the frequency of the input signal (IN) after the sum of the first and second count values of one or more successive measuring periods in the input signal (IN) exceeds a minimum number of counted clock edges in the reference clock signal.

2. An arrangement for determining frequency, comprising:
an input (1) for feeding in an input signal (IN);
a first counter (40) for counting clock edges of a reference clock signal (CLK) while the input signal (IN) corresponds to a first level value (L1);
a second counter (50) for counting clock edges of the reference clock signal (CLK) while the input signal (IN) corresponds to a second level value (L2); and
an evaluation unit (60) that is coupled to the first and the second counter (40, 50), in order to determine a first and a second count value (N1, N2), and is set up to determine a frequency of the input signal (IN) as a function of the first and the second count value (N1, N2);
wherein the evaluation unit (60) is set up to determine the first and the second count value (N1, N2) in such a way that the first count value (N1) is determined by a counter result of the first counter (40) when the input signal (IN) no longer corresponds to the first level value (L1) and the second count value (N2) is determined by a counter result of the second counter (50) when the input signal (IN) no longer corresponds to the second level value (L2); and
wherein the second count value (N2) is determined by an instantaneous counter status of the second counter (50) when the input signal (IN) corresponds to the second level value (L2) and this instantaneous counter status exceeds a predefined comparison value, so that the actual frequency can be determined earlier.

3. The arrangement as claimed in claim 2, wherein the evaluation unit (60) is set up to determine the frequency of the input signal (IN) as a function of the sum of the first and the second count value (N1, N2).

4. The arrangement as claimed in claim 2, wherein the comparison value is given as a function of at least one of the following:
the first count value (N1);
the second count value (N2) of a previous determination of the frequency of the input signal (IN).

* * * * *